Figure 1:
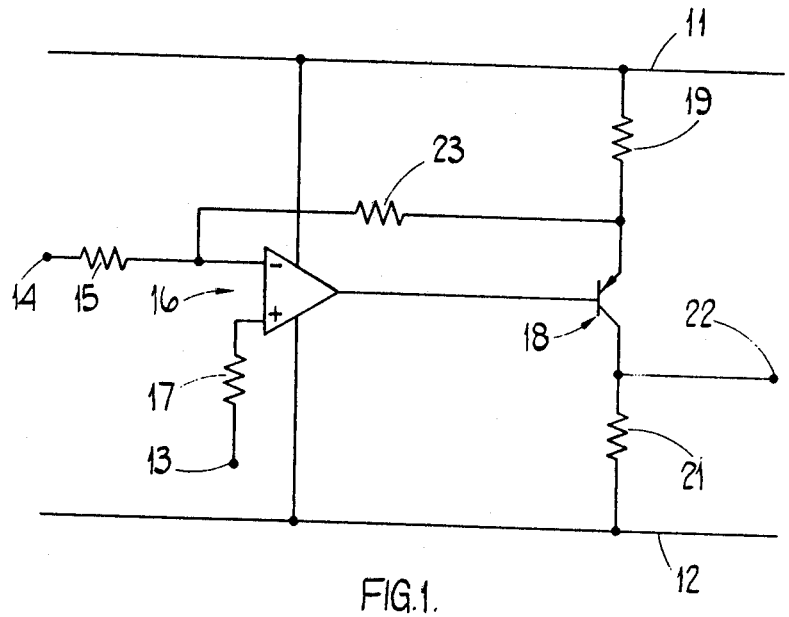

United States Patent [19]
Hodgson

[11] 3,958,170
[45] May 18, 1976

[54] FULL WAVE RECTIFIERS
[75] Inventor: Duncan Barry Hodgson, Leamington Spa, England
[73] Assignee: Joseph Lucas Limited, Birmingham, England
[22] Filed: Apr. 24, 1975
[21] Appl. No.: 571,413

[30] Foreign Application Priority Data
May 21, 1974 United Kingdom............... 22530/74

[52] U.S. Cl. ................................. 321/8 R; 321/43; 328/26; 330/30 D
[51] Int. Cl.² ........................................... H02M 7/00
[58] Field of Search.................... 321/8 R, 43, 47; 330/30 D; 328/26

[56] References Cited
UNITED STATES PATENTS

| | | | |
|---|---|---|---|
| 3,310,726 | 3/1967 | James................................. | 321/8 R |
| 3,419,787 | 12/1968 | Baehre............................. | 321/47 X |
| 3,648,062 | 3/1972 | Bozoian........................... | 321/47 X |
| 3,665,290 | 5/1972 | Trok................................... | 321/47 |
| 3,723,766 | 3/1973 | Sordello...................... | 330/30 D X |
| 3,787,755 | 1/1974 | Goldner........................... | 321/47 X |

FOREIGN PATENTS OR APPLICATIONS
1,908,382 9/1969 Germany............................. 321/47

*Primary Examiner*—William M. Shoop
*Attorney, Agent, or Firm*—Holman & Stern

[57] ABSTRACT

A full wave rectifier comprises positive and negative supply lines, and a differential input amplifier which is powered by the positive and negative supply lines and which has its inverting input terminal connected through an impedance to an input terminal to which the a.c. signal to be rectified is fed. The non-inverting input terminal of the differential input amplifier is connected to a terminal at a potential intermediate the positive and negative supply lines, and a transistor has its base connected to the output terminal of the differential input amplifier. The emitter and collector of the transistor are connected through resistors to the supply lines, while the emitter of the transistor is also connected through an impedance to the inverting input terminal of the differential input amplifier, the output of the full wave rectifier being taken from the collector of the transistor.

2 Claims, 2 Drawing Figures

FULL WAVE RECTIFIERS

This invention relates to full wave rectifiers.

A full wave rectifier according to the invention comprises in combination positive and negative supply lines, a differential input amplifier which is powered by the positive and negative supply lines and has its inverting input terminal connected through an impedance to an input terminal to which the a.c. signal to be rectified is fed, the non-inverting input terminal of the differential input amplifier being connected to a terminal at a potential intermediate the positive and negative supply lines, and a transistor having its base connected to the output terminal of the differential input amplifier and its emitter and collector connected through resistors to the supply lines, the emitter of the transistor being connected through an impedance to the inverting input terminal of the differential input amplifier and the output of the full wave rectifier being taken from the collector of the transistor.

Figure 2:
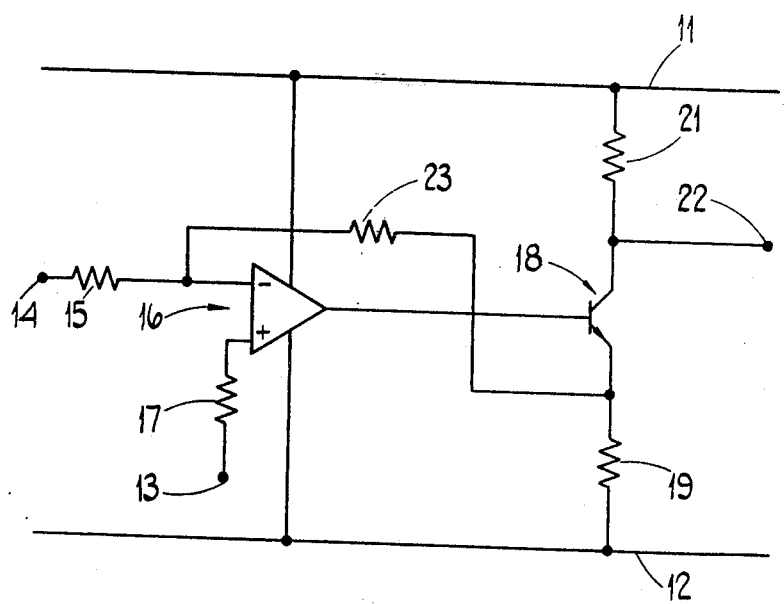

In the accompanying drawings,

FIGS. 1 and 2 are circuit diagrams illustrating two examples of the invention.

Referring to FIG. 1, there are provided positive and negative supply lines 11, 12, and a terminal 13 which is at a potential intermediate the potentials of the lines 11, 12. Typically, the lines 11, 12 are at equal and opposite potentials, and the terminal 13 is at earth potential. An a.c. signal to be rectified is fed to a terminal 14 which is connected through a resistor 15 to the inverting input terminal of a differential input amplifer which is in the form of an operational amplifier 16 and is connected between the lines 11, 12. The non-inverting input terminal of the amplifier 16 is connected through a resistor 17 to the terminal 13, and the output terminal of the amplifier 16 is connected to the base of a p-n-p transistor 18 having its emitter and collector connected through resistors 19, 21 respectively to the lines 11, 12. An output terminal 22 is connected to the collector of a transistor 18, and the emitter of the transistor 18 is connected through a resistor 23 to the inverting input terminal of the amplifier 16.

The resistors 19 and 21 are of equal values in the preferred arrangement, and the transistor 18 has a saturation voltage considerably less than the supply voltage. With the terminal 14 at earth potential, the emitter potential will also be earth potential, and the transistor 18 is saturated. Suppose now that the inverting input goes positive, then because of the action of the amplifier 16, the emitter of the transistor will go negative. The transistor will still be in saturation and so the collector potential will follow the negative potential at the emitter. There will of course be a gain determined by the ratio of the resistors 23, 15. When the potential of the terminal 14 goes negative, the emitter of the transistor 18 goes positive and the transistor comes out of saturation, so that the collector potential again goes negative by an amount equal to the input potential multiplied by the ratio of the resistors 23 and 25. Thus, the signal appearing at the terminal 22 will be negative with respect to the terminal 13, and will of course be rectified.

In the arrangement of FIG. 2, the transistor 18 is an n-p-n transistor with its emitter connected to the line 12 through the resistor 19 and its collector connected to the line 11 through the resistor 21. The operation is exactly the same as FIG. 1, except that the rectified signal at the terminal 22 is now positive with respect to the terminal 13.

It will be appreciated that the invention may be applied to any similar circuit arrangement where resistors 15 and 23 may be replaced by frequency sensitive networks, resulting in there being available at the terminal 22 a full-wave rectified version of the input wave-form modified by the frequency sensitive gain characteristic of the networks and the amplifier 16.

I claim:

1. A full wave rectifier comprising in combination positive and negative supply lines, a differential input amplifier which is powered by the positive and negative supply lines and has its inverting input terminal connected through an impedance to an input terminal to which the a.c. signal to be rectified is fed, the non-inverting input terminal of the differential input amplifier being connected to a terminal at a potential intermediate the positive and negative supply lines, and a transistor having its base connected to the output terminal of the differential input amplifier and its emitter and collector connected through resistors to the supply lines, the emitter of the transistor being connected through an impedance to the inverting input terminal of the differential input amplifier and the output of the full wave rectifier being taken from the collector of the transistor.

2. A rectifier as claimed in claim 1, wherein the amplifier is an operational amplifier.

* * * * *